(12) United States Patent
Fang et al.

(10) Patent No.: US 11,314,134 B2
(45) Date of Patent: Apr. 26, 2022

(54) THIN FILM TRANSISTOR SUBSTRATE AND LIQUID CRYSTAL DISPLAY PANEL

(71) Applicant: Century Technology (Shenzhen) Corporation Limited, Shenzhen (CN)

(72) Inventors: Ning Fang, Shenzhen (CN); Chih-Chung Liu, New Taipei (TW); Meng-Chieh Tai, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 0 days.

(21) Appl. No.: 17/147,772

(22) Filed: Jan. 13, 2021

(65) Prior Publication Data
US 2021/0132452 A1    May 6, 2021

Related U.S. Application Data

(62) Division of application No. 16/221,915, filed on Dec. 17, 2018, now Pat. No. 10,928,692.

(30) Foreign Application Priority Data

Apr. 20, 2018 (CN) .......................... 201810361748.2

(51) Int. Cl.
| | |
|---|---|
| *G02F 1/1362* | (2006.01) |
| *H01L 27/12* | (2006.01) |
| *G02F 1/1368* | (2006.01) |
| *G02F 1/1339* | (2006.01) |
| *G02F 1/1335* | (2006.01) |
| *G02F 1/1345* | (2006.01) |

(52) U.S. Cl.
CPC ...... *G02F 1/136259* (2013.01); *G02F 1/1339* (2013.01); *G02F 1/1368* (2013.01); *G02F 1/13454* (2013.01); *G02F 1/133514* (2013.01); *G02F 1/136286* (2013.01); *H01L 27/124* (2013.01); *G02F 1/136263* (2021.01); *G02F 2201/121* (2013.01)

(58) Field of Classification Search
CPC ........... G02F 1/13623; G02F 1/136259; G02F 1/1339; G02F 1/13454; G02F 1/136286; G02F 2201/121; G02F 1/136272; H01L 27/124

See application file for complete search history.

(56) References Cited

U.S. PATENT DOCUMENTS

| | | |
|---|---|---|
| 2009/0033823 A1 | 2/2009 | Chung et al. |
| 2009/0296013 A1 | 12/2009 | Liu et al. |
| 2012/0169986 A1 | 7/2012 | Kwon et al. |
| 2018/0059449 A1 | 3/2018 | Kim |
| 2018/0224705 A1 | 8/2018 | Nakagawa |

FOREIGN PATENT DOCUMENTS

| | | |
|---|---|---|
| CN | 101122695 A | 2/2008 |
| CN | 101520560 A | 9/2009 |
| WO | 2017060980 A1 | 4/2017 |

*Primary Examiner* — Jessica M Merlin
(74) *Attorney, Agent, or Firm* — ScienBiziP, P.C.

(57) ABSTRACT

A thin film transistor substrate of reduced repaired line length and capacitance includes first repairing lines, data lines and second repairing lines insulated from each other. If one of the data lines is broken, the first repairing lines is electrically coupled to the input end of the broken data line, the second repairing line is electrically coupled to the output end of the broken data line, and the first repairing is electrically coupled to the second repairing line.

10 Claims, 11 Drawing Sheets

THIN FILM TRANSISTOR SUBSTRATE AND LIQUID CRYSTAL DISPLAY PANEL

CROSS-REFERENCE TO RELATED APPLICATIONS

This application is a divisional application of U.S. Ser. No. 16/221,915, filed Dec. 17, 2018 the contents of which are hereby incorporated by reference. The patent application Ser. No. 16/221,915 in turn claims priority from Chinese Patent Application No. 201810361748.2 filed on Apr. 20, 2018.

FIELD

The subject matter herein generally relates to displays.

BACKGROUND

Generally, a liquid crystal display (LCD) includes a TFT (Thin Film Transistor) substrate, the TFT substrate includes a wiring area and a display area. A plurality of data lines and a plurality of gate lines (also referred as scan lines) extend from the display area to the wiring area. In manufacturing the TFT substrate, some of the data lines may be broken. Therefore, when the TFT substrate is designed, a repair line for repairing the broken data lines is provided, which can greatly improve the yield of the TFT substrate. A conventional way to repair the broken data lines often uses an operational amplifier, so that resistance and capacitance of the repair line has little effect on the TFT substrate. However, the use of operational amplifiers greatly increases the cost of making the TFT.

Therefore, there is room for improvement in the art.

BRIEF DESCRIPTION OF THE DRAWINGS

Implementations of the present technology will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

Figure 1:
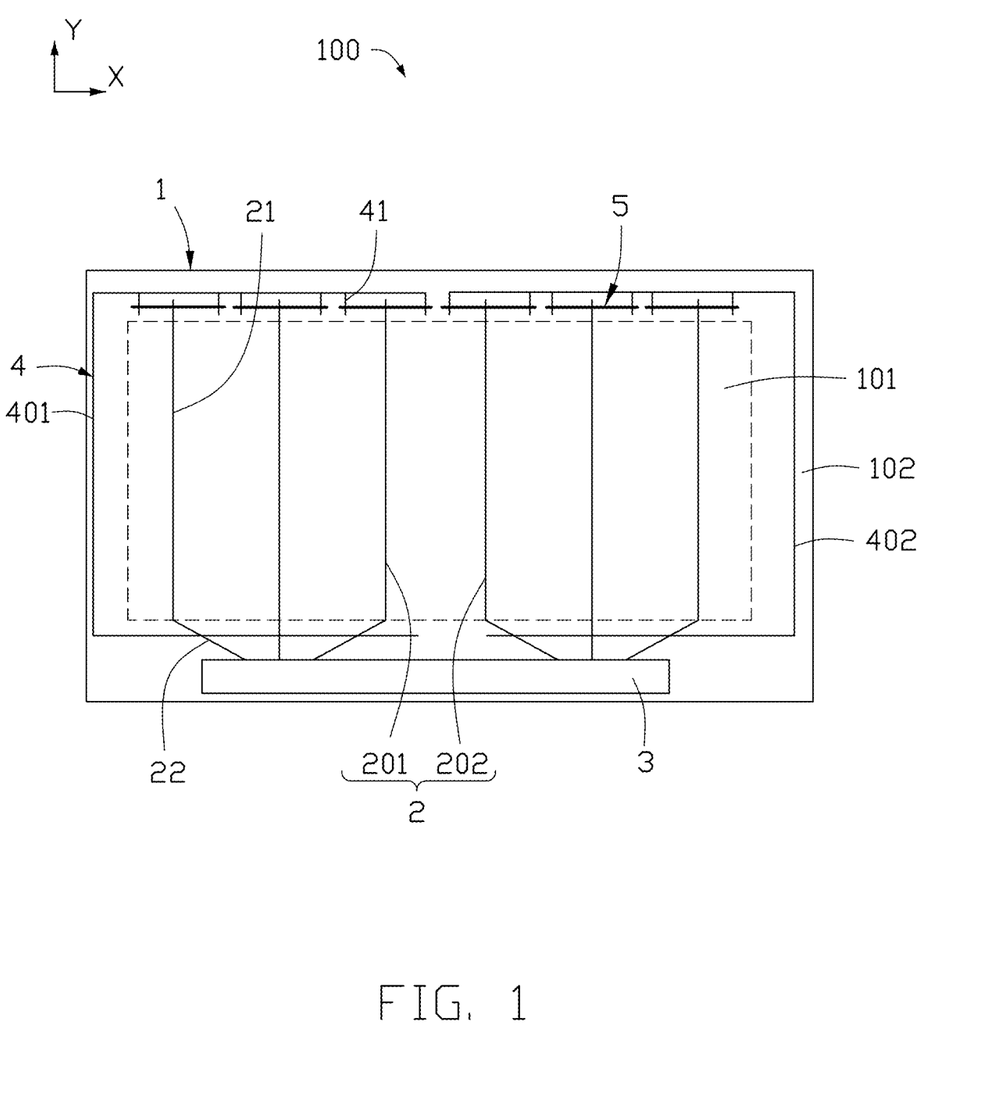
FIG. 1 is a planar view of a TFT substrate of a first embodiment.

As shown in FIG. 1, A TFT substrate 100 includes a substrate 1, a plurality of TFTs (not shown), a plurality of gate lines (not shown), a plurality of data lines 2, and a driving circuit 3. FIG. 1 only shows some elements in TFT substrate, other elements such as the gate lines and the TFTs are omitted.

Only six data lines 2 are shown in FIG. 1, but the number of data lines 2 is not limited thereto. For example, in an embodiment, the TFT substrate 100 may include 1280 data lines. In the embodiment, the data line 2 is divided into a first group of data lines 201 and a second group of data lines 202. The first group of data lines 201 and the second group of data lines 202 are electrically connected to the driving circuit 3.

As shown in FIG. 1, the substrate 1 defines a central area 101 and a peripheral area 102 surrounding the central area 101. The gate lines and the data lines 2 intersect each other in the central area 101 to define a plurality of pixels (not shown). Each data line 2 extends across the central area 101 in a first direction (Y direction in FIG. 1) and has an output end 21 and an input end 22 located in the peripheral area 102, the input end 22 connecting to the driving circuit 3. In this embodiment, the substrate 1 and the central region 101 are both substantially rectangular, and the output end 21 and the input end 22 are located on opposite sides of the central region 101.

As shown in FIG. 1, the TFT substrate 100 further includes at least one first repairing line 4 and a plurality of second repairing lines 5. In an embodiment, when the TFT substrate 100 is applied in a liquid crystal display device (not shown), the first repairing line 4 and the second repairing lines 5 are located in the peripheral region 102 to avoid affecting the display function.

The data line 2, the first repairing line 4, and the second repairing lines 5 are located in different three layers. The data line 2, the first repairing line 4, and the second repairing lines 5 are insulated from each other by at least one insulating layer (not shown). In an embodiment, the data line 2, the first repairing line 4, and the second repairing lines 5 are substantially located in the same layer, and projections of portions of the data line 2, the first repairing line 4, and the second repairing lines 5 on the substrate are at least partially overlap with each other on the substrate 1. The data line 2, the first repairing line 4, and the second repairing lines 5 are insulated from each other by at least one insulating layer.

As shown in FIG. 1, the second repairing line 5 is located on a side of the peripheral area 102 near the output end 21. In this embodiment, the TFT substrate 100 includes six second repairing lines 5, a projection of each second repairing line 5 on the substrate 1 at least partially overlaps with one data line 2. In this embodiment, the projection of each second repairing line 5 on the substrate 1 perpendicularly intersects a data line 2. It can be understood that, in other embodiment, the projection of each second repairing line 5 on the substrate 1 may intersect with at least one data line 2. The number of the second repairing lines 5 is not limited, the number of the second repairing lines 5 of the TFT substrate 100 may be less or more than 6. In an embodiment, an overlapping area between the projection of each second repairing line 5 on the substrate 1 and the projection of each data line 2 on the substrate 1 is the same, which is beneficial for making resistance and capacitance of each data line almost the same. Specifically, the number of data lines 3 overlapping with second repairing lines 5 is the same, so that the overlapping area between the projection of each second repairing line 5 on the substrate 1 and the projection of each data line 2 on the substrate 1 is the same. In an embodiment, length of each second repairing line 5 is the same.

As shown in FIG. 1, in this embodiment, the TFT substrate 100 includes two first repairing lines 4. Each group of data lines 2 corresponds to one first repairing line 4, and each group of data line 2 shares one first repairing line 4. The one first repairing line 4 circumvents the disconnection of any one of the data lines 2 in the same group. It can be understood that each first repairing line 4 corresponds to second repairing lines 5 which are overlapped by the same group of data lines 2. In this embodiment, the two first repairing lines 4 are located on the two side of the TFT substrate 100, both length and width of each first repairing line being the same.

Each first repairing line 4 extends from the side of the peripheral area 102 adjacent the output end 21 along the peripheral area 102 to the input end 22. The projection of the first repairing line 4 adjacent to the output end 21 on the substrate 1 at least partially overlaps the corresponding second repairing line 5, and the projection of the first repairing line 4 adjacent to the input end 22 on the substrate 1 at least partially overlaps the input end 22 of each data line 2 in the corresponding group. In an embodiment, the overlapping area between the projection of each first repairing line 4 on the substrate 1 and the projections of all the data lines 2 on the substrate 1 is the same.

As shown in FIG. 1, in this embodiment, each first repairing line 4 has a plurality of extending portions 41 adjacent to the output end 21, a projection of each extending portion 41 at least partially overlaps one second repairing line 5 on the substrate 1. In this embodiment, the first repairing lines 4 are divided into a first group of first repairing lines 401 and a second group of first repairing lines 402. A projection of the first group of first repairing lines 401 on the substrate 1 at least partially overlaps the input ends 22 of first group of data lines 201, a projection of the second group of first repairing lines 402 on the substrate 1 at least partially overlaps the input ends 22 of second group of data lines 202.

In this embodiment, each first repairing line 4 includes six extending portions 41. Two adjacent extending portions 41 are defined as a group, the projections of the two extending portions 41 on the substrate 1 in the same group at least partially overlap two ends of one second repairing line 5. In other embodiment, the projection of each second repairing line 5 on the substrate 1 may be overlapped by one extending portion 41. The second repairing line 5 may be overlapped by the extending portion 41 at one end of the second repairing line 5 or at the middle of the second repairing line 5. In an embodiment, the projection of each second repairing line 5 on the substrate 1 may overlap with at least three extending portions 41, as long as the second repairing line 5 can be electrically coupled to the first repairing line 4 through the extending portion 41. In this embodiment, the input end 22 and the output end 21 of each data line 2 are coupled to the same first repairing line 4 directly or indirectly (such as by the second repairing line 5).

Figure 2:
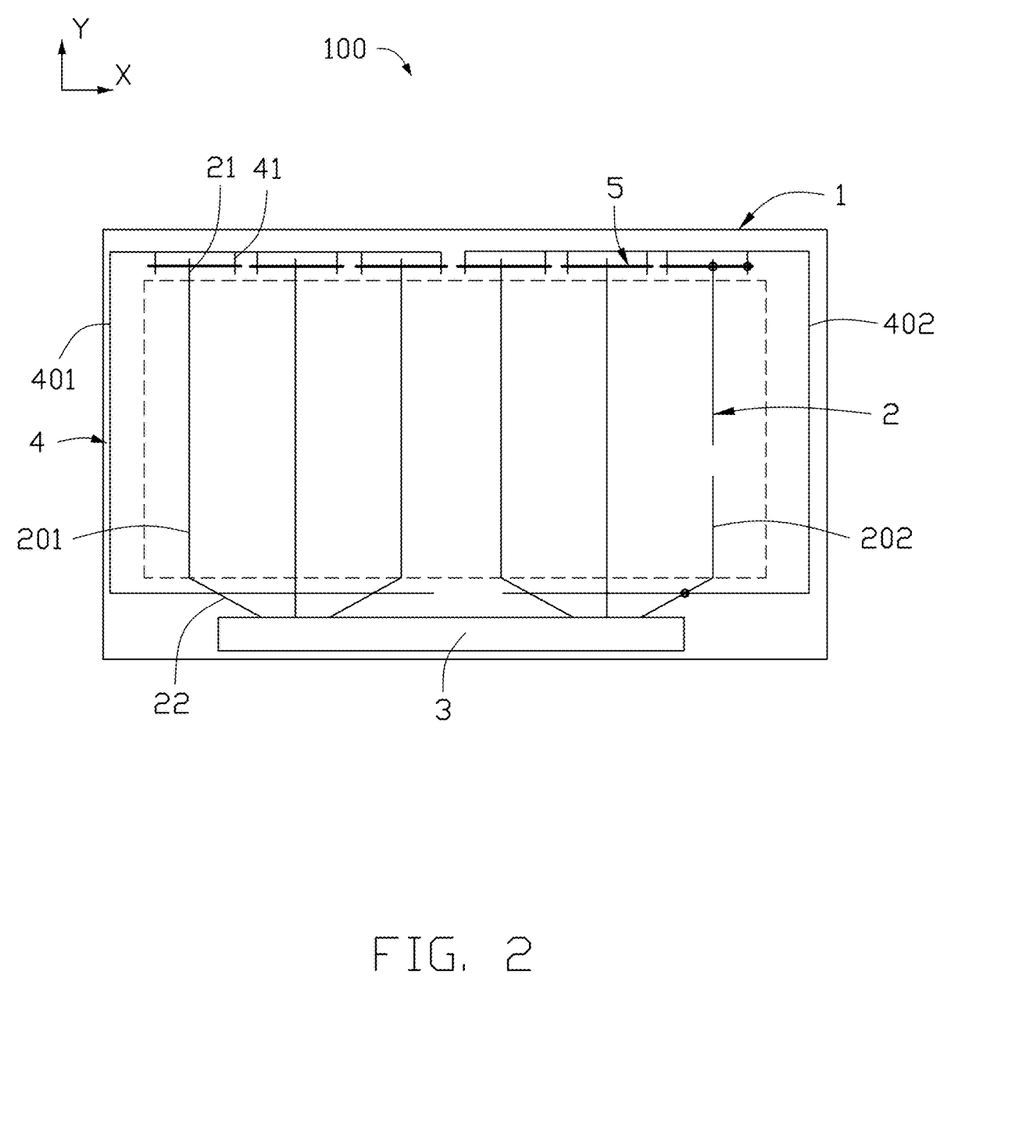
FIG. 2 is a schematic diagram of a repair of a broken data line according to a first embodiment.

As shown in FIG. 2, when one of the data lines 2 is broken, information cannot be transmitted by the broken data line 2. Therefore, the first repairing line 4 may be electrically connected to the input end 22 of the broken data line 2, the first repairing line 4 may be electrically connected to the corresponding second repairing line 5, and the second repairing line 5 may be electrically connected to the output end 21 of the broken data line 2.

In this embodiment, portions of the insulating layers (not shown) between the broken data lines 2, the first repairing lines 4, and the second repairing lines 5 may be removed by laser fusing, so that the output end 21 of the broken data line 2 and the second repairing line 5 are electrically connected. Thus the first repairing line 4 and the second repairing line 5 are electrically connected, and the first repairing line 4 and the second repairing line 5 are electrically coupled to the driving circuit 3 by the data line 2 between the first repairing lines 4 and the drive circuit 3 to connect the input end 22 and the output end 21 of the broken data line 2.

In this embodiment, the plurality of second repairing lines 5 are used in TFT substrate 100, so that each second repairing line 5 is not be too long, and weak signals and insufficient thrust due to an excessively long second repairing line 5 can be avoided. Therefore, it is possible to reduce the manufacturing cost without using an operational amplifier.

In addition, since the operational amplifier is not used, it is necessary to consider the effects of resistance and capacitance after repair.

From the resistance $R=\rho L/A$, ($\rho$ is the resistivity (determined by the material properties), L is the length of the second repairing line 5, and A is the area of the second repairing line 5), it is known that when the line width is constant, the resistance of the second repairing line 5 is proportional to the length of the second repairing line 5. In this embodiment, the design of the plurality of second repairing lines 5 and the selection of the extending portion 41 closest to the broken data line 2 during repair can ensure that the length of the second repairing line 5 is the shortest, so that the second repairing line 5 used for repairing has the lowest resistance.

In addition, the design of the plurality of second repairing lines 5 can also reduce the number of data lines 2 overlapping with the projection of the second repairing line 5 on the substrate 1, therefore the capacitance of a repaired data line 2 is reduced.

Figure 3:
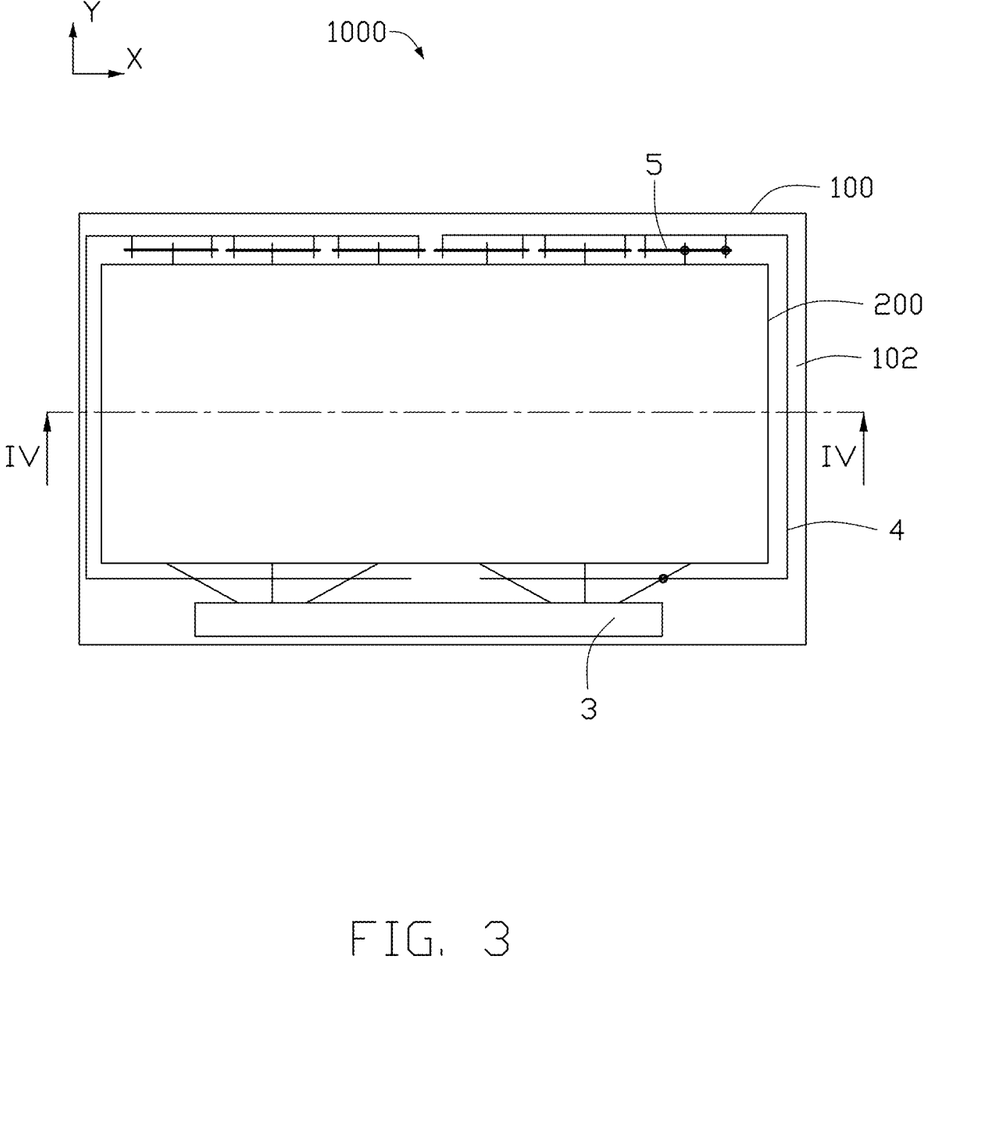
FIG. 3 is a planar view of a liquid crystal display panel of a first embodiment.
Figure 4:
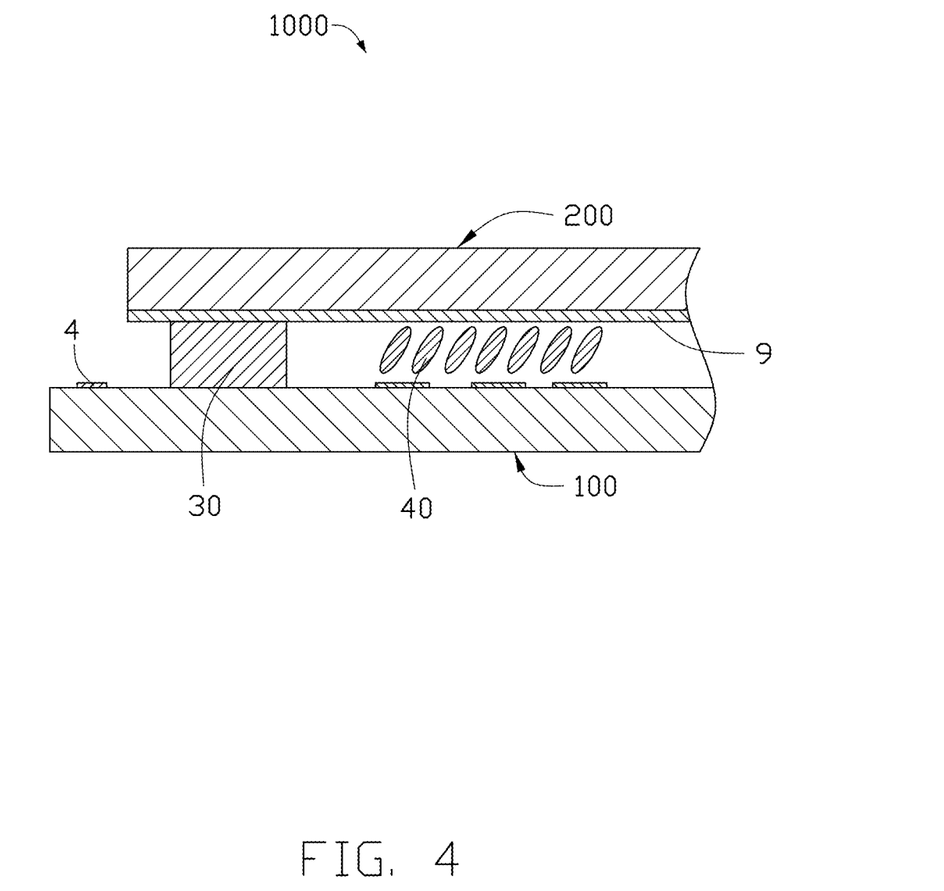
FIG. 4 is a cross-sectional view along line IV-IV of FIG. 3.

As shown in FIG. 3 and FIG. 4, a display panel 1000 includes a TFT substrate 100 and a CF (color filter) substrate 200. As shown in FIG. 3, the TFT substrate 100 may be a little larger than the CF substrate 200 such that the CF substrate 200 partially covers the peripheral region 102 of the TFT substrate 100. In this embodiment, the CF substrate does not cover the first repairing lines 4 and the second repairing lines 5. As shown in FIG. 4, the display panel 1000 includes a sealant 30 for bonding the TFT substrate 100 and the CF substrate 200, and a liquid crystal 40 is located between the TFT substrate 100, the CF substrate 200, and the sealant 30. The display panel 1000 further includes a common electrode layer 9 located on a side of the CF substrate 200 adjacent to the TFT substrate 100. The common electrode layer 9 interacts with pixel electrodes (not shown) located on the TFT substrate 100 to form an electric field to drive the liquid crystal 40 to rotate.

In this embodiment, the first repairing line 4 is located on a side of the sealant 30 away from the liquid crystal 40. Since the first repairing lines 4 are located at the peripheral region 102 of the TFT substrate 100 and not covered by the CF substrate 200, nor is there overlap with the projection of the common electrode 9 on the substrate 1, the first repairing line 4 does not generate additional capacitance, and the capacitance between the first repairing line 4 and the common electrode 9 is close to zero.

Figure 5:
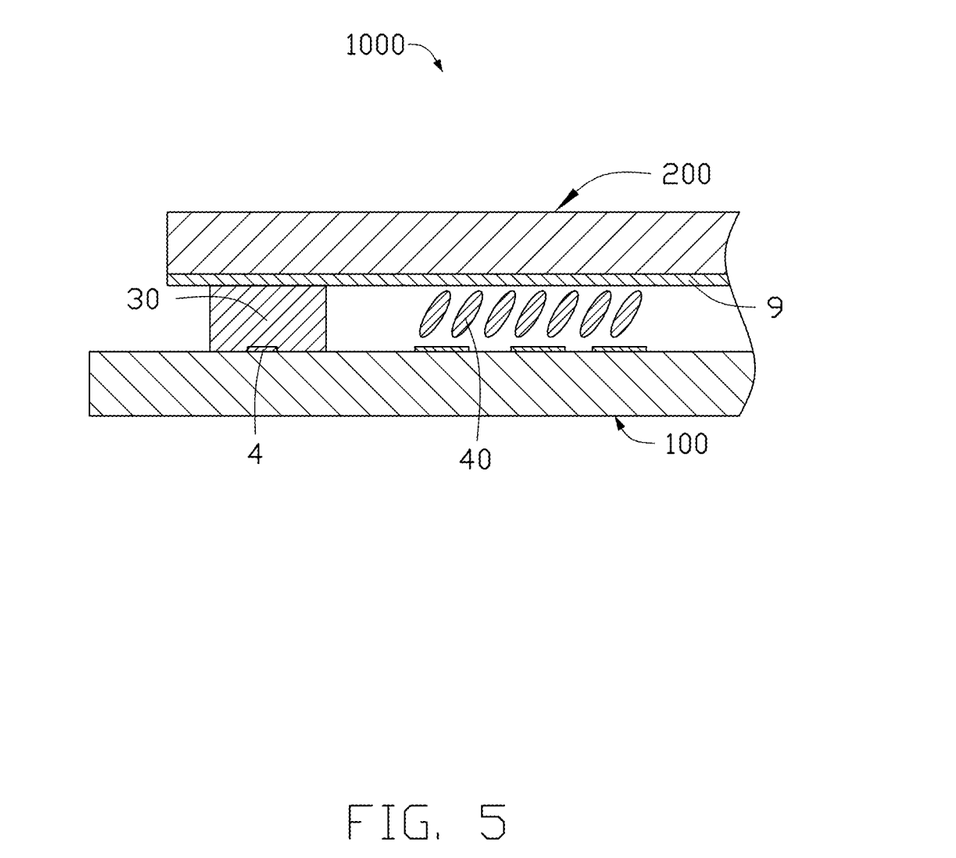
FIG. 5 is a cross-sectional view of a liquid crystal display panel of a second embodiment.
Figure 6:
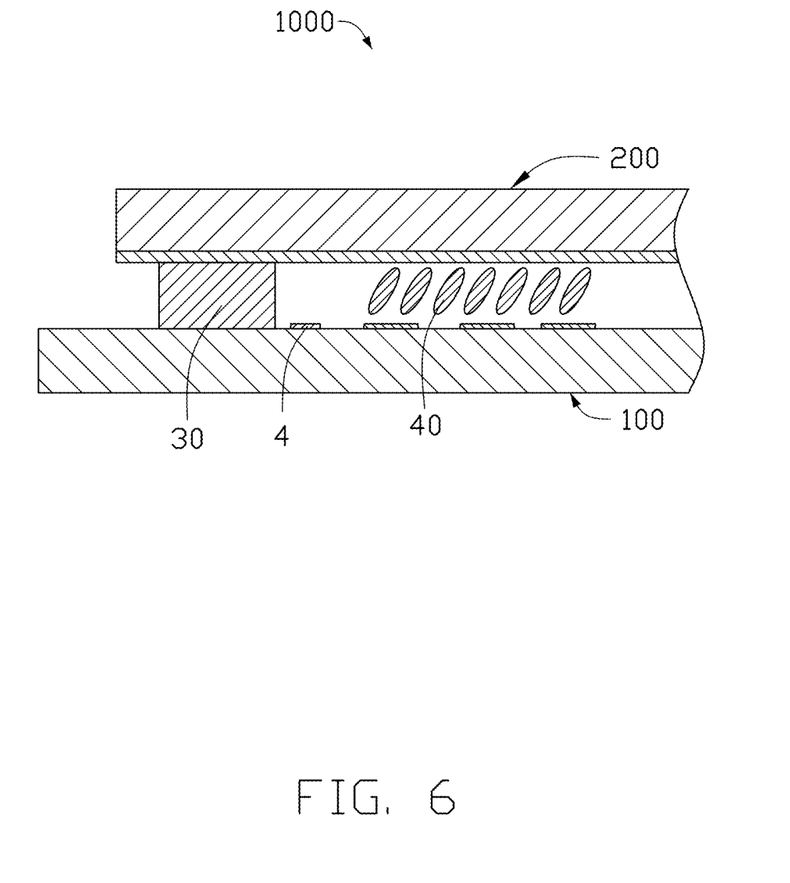
FIG. 6 is a cross-sectional view of a liquid crystal display panel of a third embodiment.

As shown in FIG. 5, in an embodiment, the first repairing lines 4 are located on the TFT substrate 100 and under the sealant 30. As shown in FIG. 6, in an embodiment, the first repairing lines 4 are located on a side of the sealant 30 close to the liquid crystal 40. Although the projections of the first repairing lines 4 according to FIG. 5 and FIG. 6 on the substrate 1 both overlap with the common electrode layer 9, the first repairing lines 4 in FIG. 5 are covered by the sealant 30, and the first repairing lines in FIG. 6 are covered by the liquid crystal 40. The dielectric constant of the sealant 30 is defined as $\varepsilon_1$, and the dielectric constant of the liquid crystal 40 is defined as $\varepsilon_2$, and the dielectric constant of the sealant 30 is smaller than the dielectric constant of the liquid crystal 40 ($\varepsilon_1 < \varepsilon_2$). For example, the dielectric constant of the sealant 30 is 3, and the dielectric constant of the liquid crystal 40 is 9. From the formula $C=\varepsilon_r\varepsilon_0 A/4d$ ($\varepsilon_r$ is the relative dielectric constant of the dielectric, $\varepsilon_0$ is the permittivity in vacuum, A is the parallel electrodes area, and d is the parallel electrodes spacing), the capacitance of the first repairing lines 4 covered by the sealant 30 is smaller than the capacitance of the first repairing line 4 not covered by the sealant 30 located on the side of the sealant 30 close to the liquid crystal 40.

It can be understood that, in this embodiment, the second repairing lines 5 are also located on a side of the sealant 30 away from the liquid crystal 40. In an embodiment, the second repairing lines 5 may be located on the TFT substrate 100 and under the sealant 30, or on a side of the sealant 30 close to the liquid crystal 40.

The data line 2, the second repairing line 5, and the first repairing line 4 are all conductive materials. The data line 2, the second repairing line 5, and the first repairing line 4 may be made of aluminum (Al), silver (Ag), gold (Au), cobalt (Co), chromium (Cr), copper (Cu), indium (In), manganese (Mn), molybdenum (Mo), nickel (Ni), niobium (Nd), palladium (Pd), platinum (Pt), titanium (Ti), tungsten (W), and zinc (Zn). In an embodiment, the data line 2, the second repairing line 5, and the first repairing line 4 may be transparent conductive materials, thus may be made of indium tin oxide (ITO) or aluminum zinc oxide (AZO).

The substrate 1 may be made of transparent glass, transparent quartz, or transparent plastic. In other embodiment, the substrate 1 may be made of ceramic or silicon. Further, the substrate 1 may be flexible. In an embodiment, the substrate 1 may be made of polyethersulfone (PES), polyethylene naphthalate (PEN), polyethylene (PE), polyimide (PI), polyvinyl chloride (PVC), or polyethylene terephthalate (PET).

Figure 7:
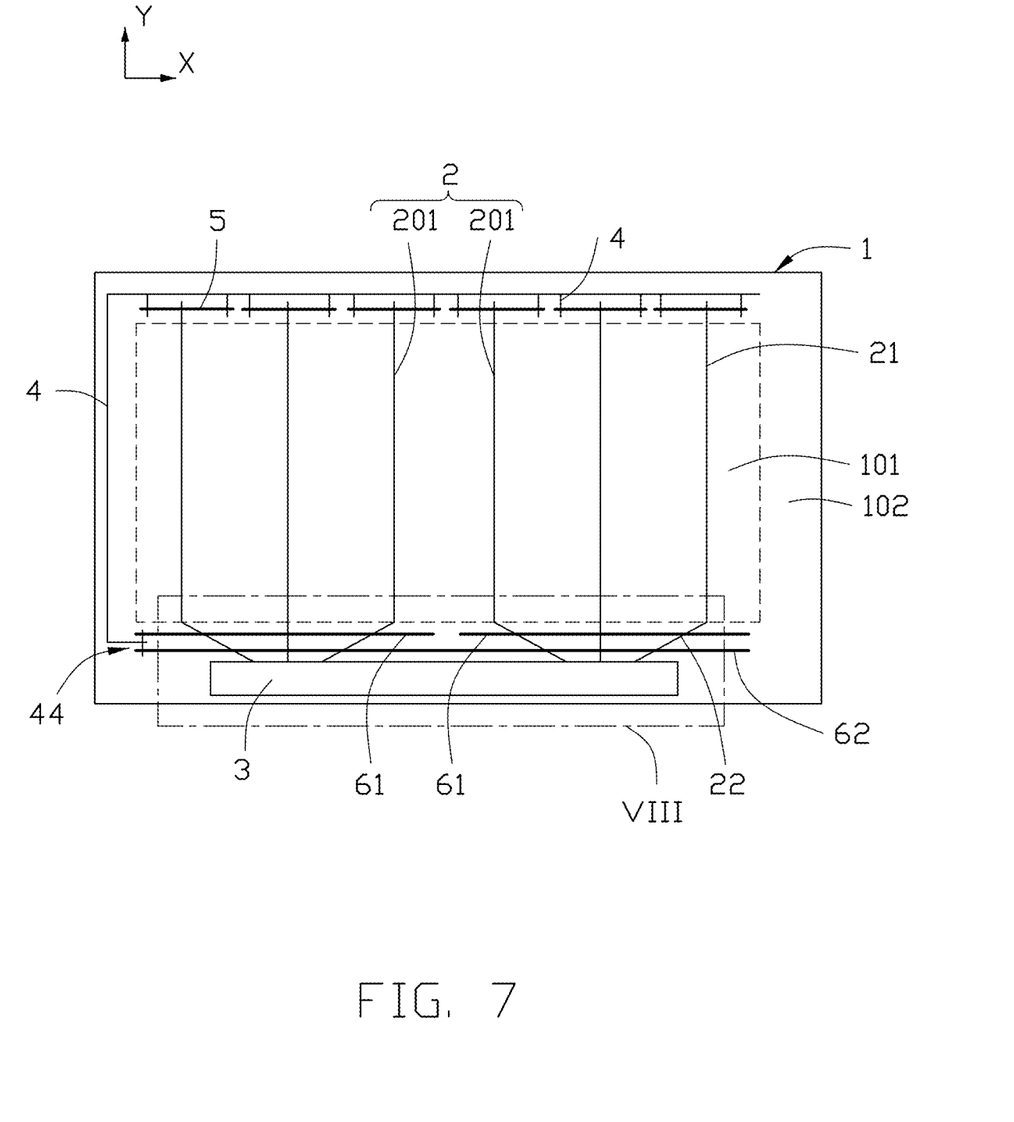
FIG. 7 is a planar view of a TFT substrate of a second embodiment.

As shown in FIG. 7, the TFT substrate 100 according to a second embodiment comprises a substrate 1, a plurality of TFTs (not shown), a plurality of gate lines (not shown), a plurality of data lines 2, and a driving circuit 3. FIG. 7 shows some elements in TFT substrate, other elements such as the gate lines and TFTs are omitted.

Further, only six data lines 2 are shown in FIG. 7, but the number of data lines 2 is not limited thereto. For example, in an embodiment, the TFT substrate 100 may include 1280 data lines. In the embodiment, the data line 2 is divided into a first group of data lines 201 and a second group of data lines 202. The first group of data lines 201 and the second group of data lines 202 are electrically connected to the driving circuit 3.

As shown in FIG. 7, the substrate 1 defines a central area 101 and a peripheral area 102 surrounding the central area 101. The gate lines and the data lines 2 intersect each other in the central area 101 to define a plurality of pixels (not shown). Each data line 2 extends across the central area 101 in a first direction (Y direction in FIG. 1) and has an output end 21 and an input end 22 located in the peripheral area 102. The input 22 connects to the drive circuit 3. In this embodiment, the substrate 1 and the central region 101 are both substantially rectangular, and the output end 21 and the input end 22 are located on opposite sides of the central region 101.

As shown in FIG. 7, the TFT substrate 100 further includes at least one first repairing line 4 and a plurality of second repairing lines 5. In an embodiment, when the TFT substrate 100 is applied in a liquid crystal display device (not shown), the first repairing line 4 and the second repairing lines 5 are located in the peripheral region 102 to avoid affecting the display function.

The data line 2, the first repairing line 4, and the second repairing lines 5 are located in three respective layers. The data line 2, the first repairing line 4, and the second repairing lines 5 are insulated from each other by at least one insulating layer (not shown). In an embodiment, the data line 2, the first repairing line 4, and the second repairing lines 5 are substantially located in the same layer, and projections of portions of the data line 2, the first repairing line 4, and the second repairing lines 5 on the substrate 1 are overlapped with each other. The data line 2, the first repairing line 4, and the second repairing lines 5 are insulated from each other by at least one insulating layer.

As shown in FIG. 7, the second repairing line 5 is located on a side of the peripheral area 102 near the output end 21. In this embodiment, the TFT substrate 100 includes six second repairing lines 5, and a projection of each second repairing line 5 on the substrate 1 at least partially overlaps with one data line 2. In this embodiment, the projection of each second repairing line 5 on the substrate 1 perpendicularly intersects with a data line 2. It can be understood that, in other embodiment, the projection of each second repairing line 5 on the substrate 1 may intersect at least one data line 2. The number of the second repairing lines 5 is not limited, the number of the second repairing lines 5 of the TFT substrate 100 may be less or more than 6. In an embodiment, an overlapping area between the projection of each second repairing line 5 on the substrate 1 and the projection of each data line 2 on the substrate 1 is the same, which is beneficial for making resistance and capacitance of each data line almost the same. Specifically, the number of the data lines 3 overlapping each second repairing line 5 is the same, so that the overlapping area between the projection of each second repairing line 5 on the substrate 1 and the projection of each data line 2 on the substrate 1 is the same. In an embodiment, length of each second repairing line 5 is the same.

As shown in FIG. 7, in this embodiment, the TFT substrate 100 includes one first repairing line 4. The first repairing line 4 extends from the side of the peripheral area 102 adjacent to the output end 21 along the peripheral area 102 to the input end 22. The projection of the first repairing line 4 adjacent to the output end 21 on the substrate 1 at least partially overlaps all the second repairing lines 5.

As shown in FIG. 7, in this embodiment, each first repairing line 4 has a plurality of extending portions 41 adjacent to the output end 21, and a projection of each extending portion 41 at least partially overlaps one second repairing line 5 on the substrate 1. In this embodiment, the first repairing line 4 includes twelve extending portions 41, two adjacent extending portions 41 define as a group, the projections of the two extending portions 41 on the substrate 1 in the same group at least partially overlap two ends of one second repairing line 5. In other embodiment, the projection of each second repairing line 5 on the substrate 1 may overlap with one extending portion 41. The second repairing line 5 may overlap with the extending portion 41 at one end of the second repairing line 5 or at the middle of the second repairing line 5. In an embodiment, the projection of each second repairing line 5 on the substrate 1 may overlap with at least three extending portions 41, as long as the second repairing line 5 can be electrically coupled to the first repairing line 4 through the extending portion 41. In this embodiment, the input end 22 and the output end 21 of each data line 2 are coupled to the same first repairing line 4 directly or indirectly (such as by the second repairing line 5).

As shown in FIG. 7, in this embodiment, the TFT substrate 100 further comprises a first connecting line 61 and a second connecting line 62. The first connecting line 61 and the second connecting line 62 are both located between the central area 101 and the driving circuit 3, and the second connecting line 62 is located on a side of the first connecting line 61 away from the central area 101. In this embodiment, the first connecting line 61 and the second connecting line 62 are located at different layers from the data lines 2 and the first repairing line 4, and the first connecting line 61, the second connecting line 62 and the second repairing line 5 are located on a same layer. It can be understood that, in other embodiment, the first connecting line 61, the second connecting line 62, and the second repairing line 5 may each be located on a different layer, as long as they are insulated from the data lines 2 and the first repairing line 4 before repairing.

As shown in FIG. 7, the TFT substrate 100 includes two first connecting lines 61 corresponding to the first group of data lines 201 and the second group of data lines 202. The two first connecting lines 61 includes a first connecting line 611 and a first connecting line 612. The first group of data lines 201 are connected to the driving circuit 3 across the first connecting line 612 and a second connecting line 62, and the second group of data lines 202 are connected to the driving circuit 3 across the first connecting line 612 and the second connecting line 62. In this embodiment, an overlapping area between the projection of each first connecting line 61 on the substrate 1 and the projection of each data line 2 on the substrate 1 is the same. The overlapping areas between the projections of the two first connecting lines 61 on the substrate 1 and the projections of the data lines 2 on the substrate 1 are the same as the overlapping areas between the projections of the second connecting line 62 and the data lines 2 on the substrate 1.

In this embodiment, the first repairing line 4 extends adjacent to the first connecting line 61 and the second connecting line 62. An end of the first repairing line 4 adjacent to the first connecting line 61 and the second connecting line 62 is formed with two connecting ends 44 overlapping with the projections of the first connecting line 61 and the second connecting line 62 on the substrate 1.

The second connecting line 62 corresponds to at least two groups of the data lines 2. In this embodiment, as shown in FIG. 7, the second connecting line 62 corresponds to the first group of data lines 201 and the second group of data lines 202, and the projection of the second connecting line 62 on the substrate 1 overlaps with all the data lines 2.

The number of the first connecting lines 61 and the second connecting lines 62 is not limited. In an embodiment, the TFT substrate can includes a plurality of first connecting lines 61 and a plurality of second connecting lines 62.

Figure 8:
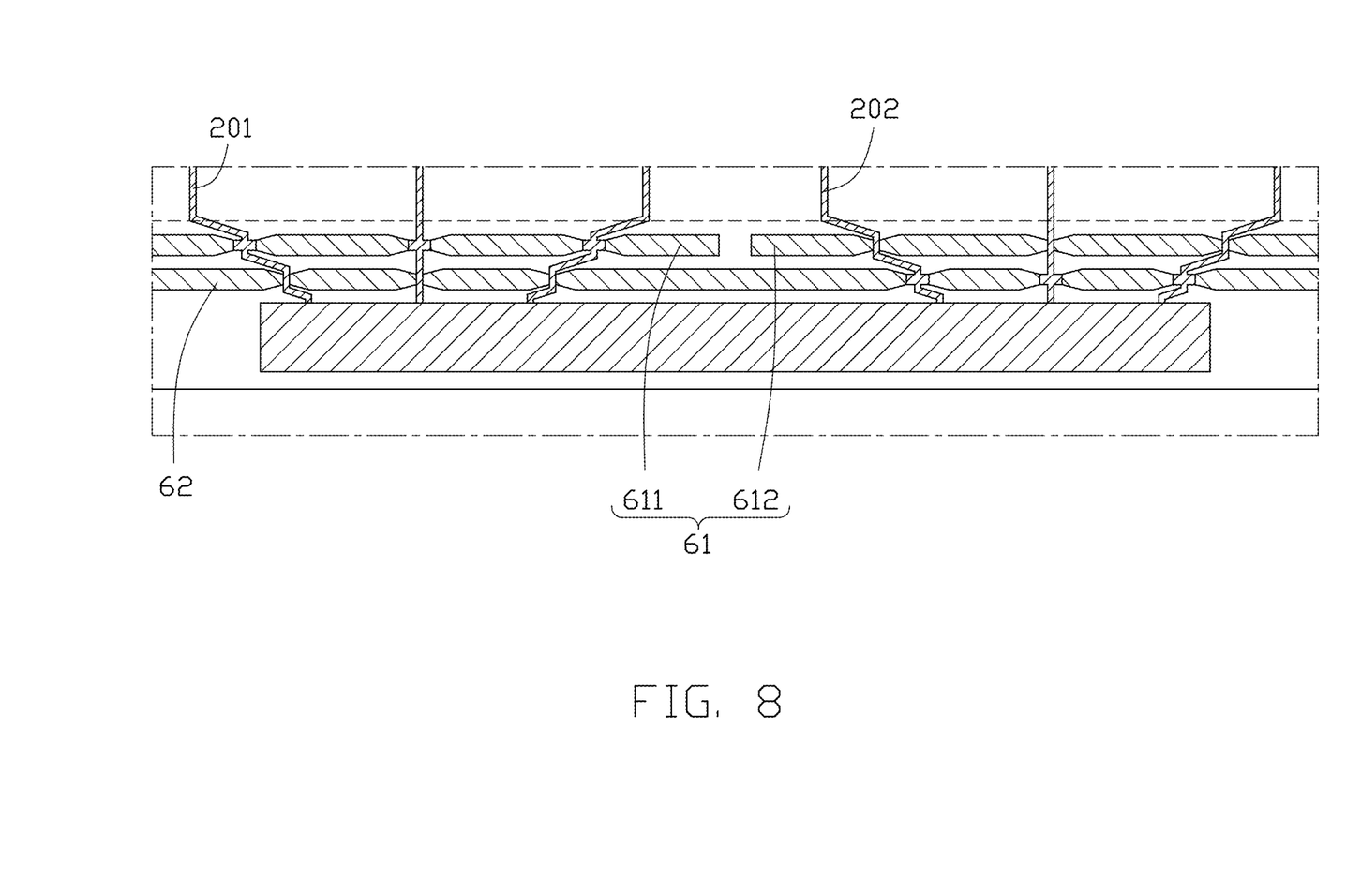
FIG. 8 is an enlarged view of a region enclosed by line VIII-VIII of FIG. 7.

As shown in FIG. 8, in this embodiment, to reduce the capacitance generated by the overlap of the data line 2 and the first connection line 61, the overlapping area of the data line 2 and the first connection line 61 must be reduced. To reduce the capacitance generated by the overlap of the data line 2 and the second connecting line 62, the overlapping area of the data line 2 and the second connecting line 62 must be reduced. In this embodiment, a line width of a point of the first connecting line 61 at which the first connecting line 61 overlaps with the data lines 2 is smaller than a line width of the first connecting line 61 where there is no overlap with the data lines 2. A point of the line width of the second connecting line 62 at which the second connecting line 62 overlaps with the data lines 2 is smaller than a line width of the second connecting line 62 where there is no overlap with the data lines 2. Further, in order to ensure the data lines 2 have sufficient areas for laser fusion when repairing, a width of the point along the data line 2 at which the data line 2 overlaps with the first connecting line 61 is larger than a width of the data line 2 where there is no overlap with the first connecting line 61. A width of the point of the data line 2 at which the data line 2 overlaps with the second connecting line 62 is larger than a width of the data line 2 where there is no overlap with the second connecting line 62.

In this embodiment, the overlapping area between the projection of the first group of data lines 201 on the substrate 1 and the projection of the first connecting lines 61 on the substrate 1 is the same as the overlapping area between the projection of the second group of data lines 202 on the substrate 1 and the projection of the second connecting lines 62 on the substrate 1. Therefore, the first group of data lines 201 and the second group of data lines 202 have the same resistance and capacitance, so that uneven display between the left and right sides is not caused by different capacitances on the left and right sides.

It can be understood that, in this embodiment, the overlapping area of the first group of data lines 201 and the first connecting line 611 is 10 μm×10 μm, the overlapping area of the first group of data lines 201 and the second connecting line 62 is 5 μm×10 μm; the overlapping area of the second group of data lines 202 and the second connecting line 62 is 10 μm×10 μm, and the overlapping area of the second group of data lines 202 and the first connecting line 612 is 5 μm×10 μm.

The second repairing lines 5 are used in TFT substrate 100, so that each second repairing line 5 is not be too long, and weak signals and insufficient thrust due to the excessively long second repairing line 5 can be avoided.

In this embodiment, the first repairing line 4, the second repairing lines 5, the first connecting line 61, and the second connecting line 62 are all located at the peripheral region 102 of the TFT substrate 100 and are not covered by the CF substrate 200.

Figure 9:
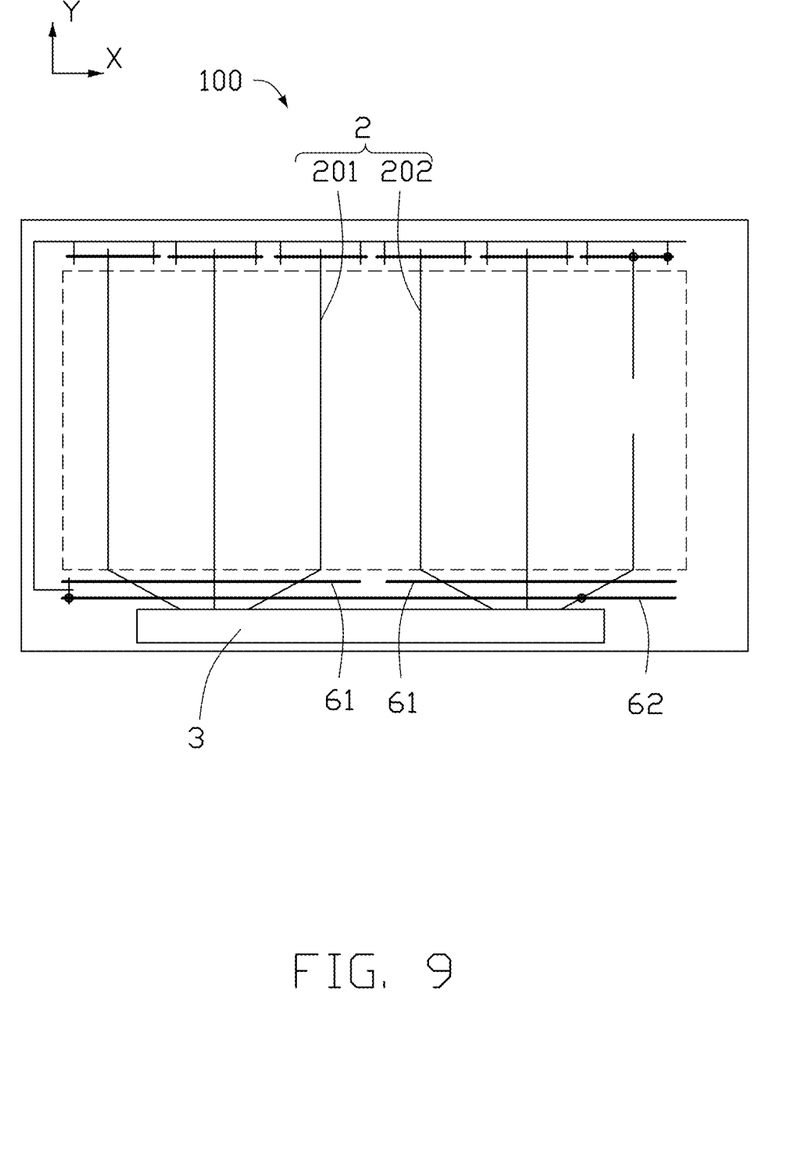
FIG. 9 is a schematic diagram of a repair of a broken data line according to a second embodiment.

As shown in FIG. 9, when one of the data lines 2 is broken from the side of the first or second connecting line 61 or 62 away from the drive circuit 3, information cannot be transmitted by the broken data line 2. In this embodiment, one of the second group of data lines 2 is for example presented as broken. A second repairing line 5 may be electrically connected to the input end 22 of the broken data line 2, the second repairing line 5 may be also electrically connected to the first repairing line 4, and the first repairing line 4 may be electrically connected to the second connecting line 62, or the second connecting line 62 may be electrically connected to the output end 21 of the broken data line 2.

In this embodiment, portions of the insulating layers (not shown) between the data lines 2, the first repairing lines 4, the second repairing lines 5, and the second connecting line 62 may be removed by laser fusing, so that the first repairing line 4, the second repairing line 5, and the second connecting line 62 are electrically connected, and electrically coupled to the driving circuit 3 by the data line 2 between the second connecting line 62 and the drive circuit 3 to connect the input end 22 and the output end 21 of the broken data line 2.

It can be understood that, in other embodiment, if one of the first group of data lines is broken, a second repairing line 5 may be electrically connected to the input end 22 of the broken data line 2. The second repairing line 5 may be also electrically connected to the first repairing line 4, and the first repairing line 4 may be electrically connected to the first connecting line 611, the first connecting line 611 being electrically connected to the output end 21 of the broken data line 2.

Figure 10:
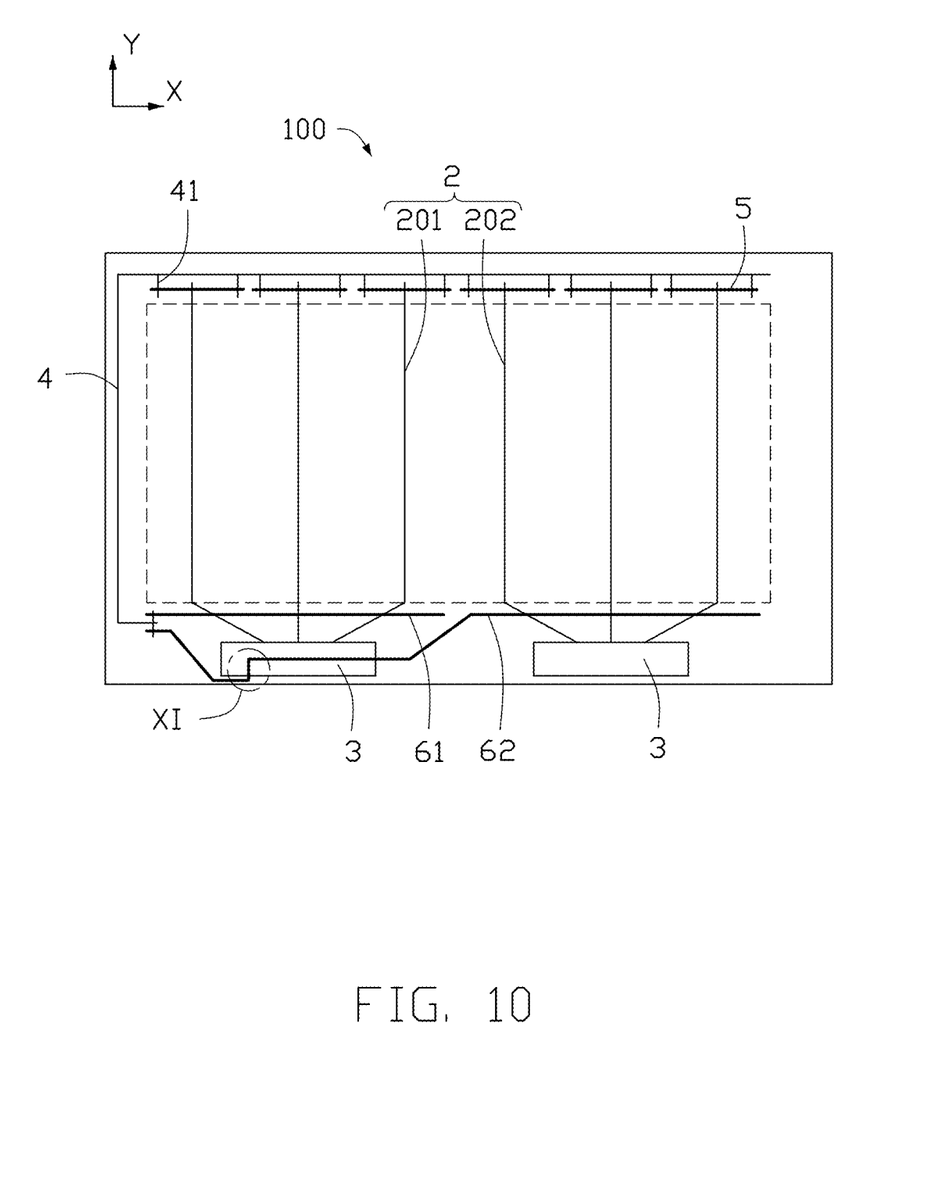
FIG. 10 is a planar view of a TFT substrate of a third embodiment.

As shown in FIG. 0.10, a TFT substrate 100 according to a third embodiment includes a first connecting line 61 and at least one second connecting line 62. The first connecting 61 and the second connecting line 62 have different structures. In this embodiment, the first connecting line 61 is shorter than the second connecting line 62. The first connecting line 61 overlaps at least partially with the first group of data lines 201, and the second connecting line 62 overlaps at least partially with the second group of data lines 202.

In this embodiment, the first group of data lines 201 and the second group of data lines 202 are connected to two different driving circuits 3. The first group of data lines 201 are connected to one of the driving circuits 3 across the first connecting line 61, and the second group of data lines 201 are connected to the other driving circuit 3 across the second connecting line 62. The projection of the first connecting line 61 on the substrate 1 overlaps with the first repairing line 4. The second connecting line 62 extends through an empty area of the driving circuit 3 connected to the first group of the data lines 201. The projection of the second connecting line 62 on the substrate 1 overlaps with the first repairing line 4. Therefore, the overlapping area between the projection of the first group of data lines 201 on the substrate 1 and the projection of the first connecting lines 61 on the substrate 1 is the same as the overlapping area between the projection of the second group of data lines 202 on the substrate 1 and the projection of the second connecting lines 62 on the substrate 1. Therefore, the first group of data lines 201 and the second group of data lines 202 have the same resistance and capacitance, so that uneven display between left and right sides because of different capacitances is not caused.

In addition, the first connection line 61 and the second connection line 62 only overlap with half of the number of data lines 2, which greatly reduces the capacitance between the data lines 2 and the first connecting line 61, or the capacitance between the data lines 2 and the second connecting line 62.

It can be understood that, in other embodiment, the TFT substrate 100 may comprises a plurality of second connecting lines 62.

Figure 11:
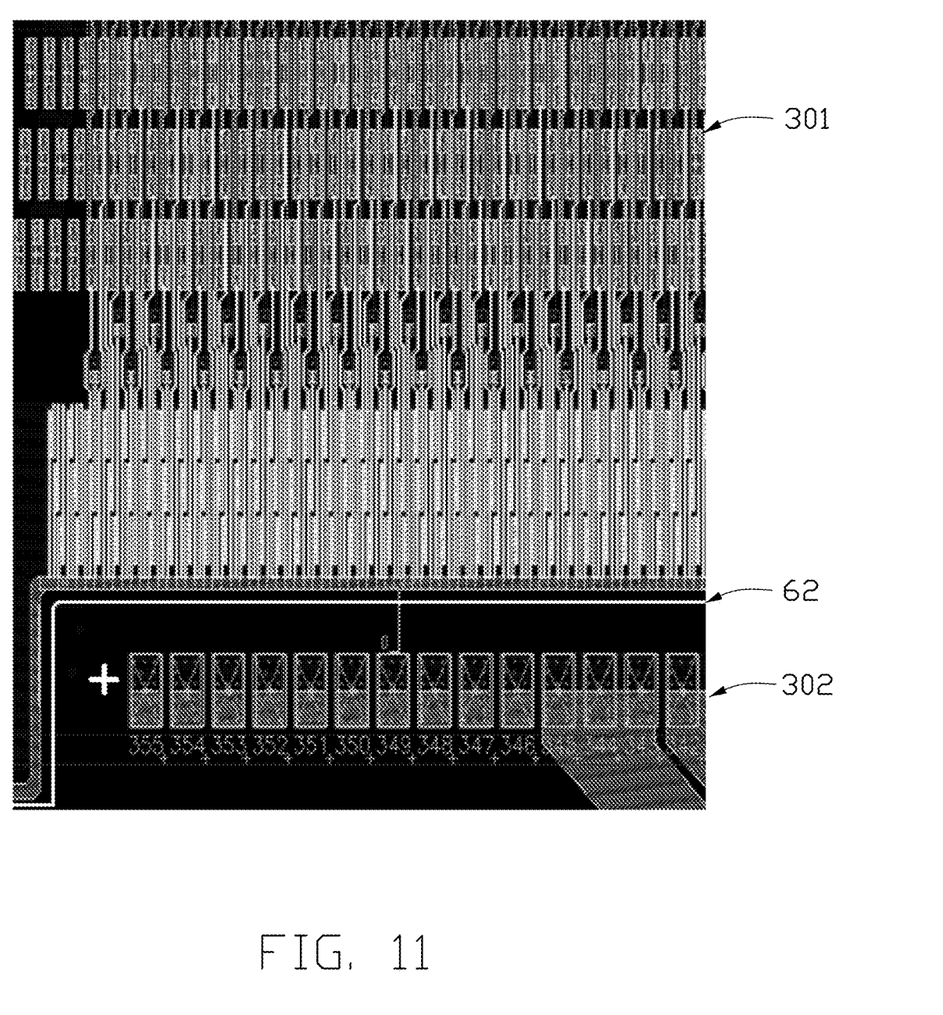
FIG. 11 is an enlarged view of a region encircled by line XI-XI of FIG. 10.

As shown in FIG. 11, in this embodiment, the second connecting line 62 is located between a switch circuit 301 and pins 302 inside the driving circuit 3 connected to the first group of data lines 201, and other components are not affected.

In this embodiment, the second repairing lines 5 are used in TFT substrate 100, so that each second repairing line 5 is not too long, and weak signals and insufficient thrust due to the excessively long second repairing line 5 can be avoided.

It can be understood that, a broken scan line may also be repaired by a method similar to that described above, and the structures and the positions of the first repairing line 4, the second repairing line 5, the first connecting line 61, and the second connecting line 62 can be adjusted accordingly.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A thin film transistor substrate, comprising:
a substrate defining a central area and a peripheral area surrounding the central area;
a plurality of data lines formed on the substrate;
wherein each of the plurality of data lines extends through the central area in a first direction, each of the plurality of data lines comprises an output end and an input end at the peripheral area;
the thin film transistor substrate further comprises at least one first repairing line, a plurality of second repairing lines and a plurality of connecting lines located at the peripheral area; the at least one first repairing line, the plurality of second repairing lines and the plurality of connecting lines are insulated from the plurality of data lines;
a projection of each of the plurality of second repairing line on the substrate at least partially overlaps with the output end of at least one of the plurality of data lines; a projection of each of the at least one first repairing line on the substrate at least partially overlaps with at least one of the plurality of second repairing lines; a projection of each of the at least one first repairing line on the substrate at least partially overlaps with at least one of the plurality of the connecting lines; each of the plurality of the connecting lines at least partially overlaps with the input end of at least one of the plurality of data lines;
if one of the plurality of data lines is broken, the input end of the broken data line is coupled with one of the plurality of connecting lines overlapping with a projection of the broken data line on the substrate, the output end of the broken data line is coupled with one of the plurality of second repairing line overlapping with the projection of the broken data line on the substrate, and the connecting line coupled with the input end of the broken data line is coupled with the second repairing line coupled with the output end of the broken data line through one of the at least one of first repairing line.

2. The thin film transistor substrate of claim 1, wherein the thin film transistor substrate comprises one first repairing line; the plurality of data lines is divided into a first group of data lines and a second group of data lines; the plurality of connecting lines comprise two first connecting lines and one second connecting line;
   a projection of one of the two first connecting lines on the substrate at least partially overlaps with the input ends of all the data lines of the first group; a projection of the other one of the two first connecting lines on the substrate at least partially overlaps with the input ends of all the data lines of the second group;
   a projection of the second connecting line on the substrate at least partially overlaps with the input ends of all the data lines of the first group and the second group;
   a projection of each of the plurality of second repairing line on the substrate at least partially overlaps with the output end of one of the at least one of the plurality of data lines;
   a projection of the first repairing line on the substrate at least partially overlaps with the plurality of second repairing lines; and
   the projection of the first repairing line on the substrate at least partially overlaps with the second connecting line and one of the two first connecting lines.

3. The thin film transistor substrate of claim 1, wherein the thin film transistor substrate comprises one first repairing line; the plurality of data lines is divided into a first group of data lines and a second group of data lines; the plurality of connecting lines comprise one first connecting line and at least one second connecting line;
   a projection of the first connecting line on the substrate at least partially overlaps all the data lines of the first group; a projection of the at least one second connecting line on the substrate at least partially overlaps all the data lines of the second group;
   a projection of each of the plurality of second repairing line on the substrate at least partially overlaps with the output end of one of the at least one of the plurality of data lines;
   a projection of the first repairing line on the substrate at least partially overlaps with the plurality of second repairing lines;
   the projection of the first repairing line on the substrate at least partially overlaps with the first connecting line; and
   the thin film transistor substrate further comprise a driving circuit electrically connected to the plurality of data lines, the driving circuit comprise an empty area; each of the at least one second connecting line extends through the empty area, and a projection of each of the at least one second connecting line on the substrate at least partially overlaps with the first repairing line.

4. The thin film transistor substrate of claim 3, wherein an overlapping area between the projection of the first connecting line on the substrate and the plurality of data lines is the same as an overlapping area between the projection of the second connecting line on the substrate and the plurality of data lines.

5. The thin film transistor substrate of claim 1, wherein an overlapping area of the projection of each of the plurality of second repairing lines on the substrate and the plurality of data lines is the same.

6. The thin film transistor substrate of claim 1, wherein a line width of a point of each of the plurality of connecting lines at which each of the plurality of connecting lines overlaps with one of the plurality of data lines is smaller than a line width of each of the plurality of connecting lines where there is no overlap with the plurality of data lines.

7. The thin film transistor substrate of claim 6, wherein a line width of a point of each of the plurality of data lines at which each of the plurality of data lines overlaps with one of the plurality of connecting lines is larger than a line width of each of the plurality of data lines where there is no overlap with the plurality of connecting lines.

8. A liquid crystal display panel, comprising:
   a thin film transistor substrate, wherein the thin film transistor substrate comprises: a substrate defining a central area and a peripheral area surrounding the central area;
   a plurality of data lines formed on the substrate;
   wherein each of the plurality of data lines extends through the central area in a first direction, each of the plurality of data lines has an output end and an input end at the peripheral area;
   the thin film transistor substrate further comprises at least one first repairing line, a plurality of second repairing lines and a plurality of connecting lines located at the peripheral area; the at least one first repairing line, the plurality of second repairing lines and the plurality of connecting lines are insulated from the plurality of data lines;
   a projection of each of the plurality of second repairing line on the substrate at least partially overlaps with the output end of at least one of the plurality of data lines; a projection of each of the at least one first repairing line on the substrate at least partially overlaps with at least one of the plurality of second repairing lines; a projection of each of the at least one first repairing line on the substrate at least partially overlaps with at least one of the plurality of the connecting lines; each of the plurality of the connecting lines at least partially overlaps with the input end of at least one of the plurality of data lines;
   if one of the plurality of data lines is broken, the input end of the broken data line is coupled with one of the plurality of connecting lines overlapping with a projection of the broken data line on the substrate, the output end of the broken data line is coupled with one of the plurality of second repairing line overlapping with the projection of the broken data line on the substrate, and the connecting line coupled with the input end of the broken data line is coupled with the second repairing line coupled with the output end of the broken data line through one of the at least one of first repairing line;
   wherein the liquid crystal display panel further comprises a color filter substrate opposite to the thin film transistor substrate, a sealant between the thin film transistor substrate and color filter substrate, and a common electrode layer on the color filter substrate.

9. The liquid crystal display panel of claim 8, wherein projections of the at least one first repairing line and the plurality of second repairing lines on the substrate are not overlapped with the common electrode layer.

10. The liquid crystal display panel of claim 8, wherein none of a projection of the plurality of connecting lines on the substrate overlapped with the common electrode layer.

* * * * *